United States Patent [19]
Acatay et al.

[11] Patent Number: 5,504,659
[45] Date of Patent: Apr. 2, 1996

[54] SHIELDING STRUCTURE

[75] Inventors: Murat Acatay, Radolfzell; Winfried Helfer, Rielasingen; Gerhard Kienle, Salem, all of Germany

[73] Assignee: Bodenseewerk Geratetechnik GmbH, Germany

[21] Appl. No.: 393,347

[22] Filed: Feb. 23, 1995

[30] Foreign Application Priority Data

Jul. 3, 1994 [DE] Germany ............... 44 07 492.1

[51] Int. Cl.⁶ ........................ H05K 9/00
[52] U.S. Cl. ............... 361/816; 361/796; 361/810; 361/818; 174/35 R; 333/182
[58] Field of Search ................... 361/752, 796, 361/816, 810, 768; 174/35 R, 35 MS, 36; 439/108, 109; 343/841; 333/246, 247, 182–185, 12; 220/402; 428/209, 546, 901

[56] References Cited

U.S. PATENT DOCUMENTS

| | | | |
|---|---|---|---|
| 4,370,700 | 1/1983 | Duddles et al. | 361/424 |
| 4,800,464 | 1/1989 | Roos et al. | 361/424 |
| 4,801,489 | 1/1989 | Nakagawa et al. | 428/209 |
| 4,945,323 | 7/1990 | Gerstenberg et al. | 333/185 |

Primary Examiner—Leo P. Picard
Assistant Examiner—Y. Whang
Attorney, Agent, or Firm—Lee, Mann, Smith, McWilliams, Sweeny & Ohlson

[57] ABSTRACT

A structure for the shielding of electronic components from outside electromagnetic fields is to be designed in such a way tha a single printed circuit board serves both to separate a "polluted" space from a "clean" space and to accommodate the components of the device to be shielded itself. To this end, the printed circuit board has a first region which is provided with an internal, grounded conductive coating, and a second region which carries the electronic components to be shielded. A housing forms a shielding partition which extends to the printed circuit board and has an end face engaging the printed circuit board between the first and second regions. The first chamber is limited by the first region of the printed circuit board. Shielding for blocking electromagnetic fields are provided in the printed circuit board adjacent partition. These shielding extend transversely to the surfaces of the printed circuit board. Through-contacts of connecting lines extending to the electronic components in the first chamber extend insulatedly through the internal, grounded conductive coating. The connecting lines furthermore extend along the printed circuit board on the side of the grounded conductive coating remote from the first chamber and insulatedly through said transversely-extending shielding to the electronic components.

13 Claims, 2 Drawing Sheets

SHIELDING STRUCTURE

BACKGROUND OF THE INVENTION

The invention relates to a structure for the shielding of electronic components arranged on a printed circuit board from outside electromagnetic fields.

U.S. Pat. No. 4,945,323 describes a structure of this type comprising a shielding housing, which defines a first chamber exposed to electromagnetic fields and a shielded second chamber. Electric conductor means extend to electronic components in the first chamber. A multi-layer printed circuit board is provided with outer surfaces and an internal, grounded conductive coating. The conductor means include through-contacts passing through the multi-layer printed circuit board.

Sensitive electronic devices such as flight or engine computer of aircraft are arranged in a chamber shielded from electromagnetic fields. Electric connecting lines are lead to these devices. The connecting lines come from a space in which strong electric or magnetic fields of high frequency can be present. The connecting lines carry intelligence signals. These intelligence signals may be analog signals or digital pulse sequences. Interfering electromagnetic fields may reach the shielded chamber or space through these connecting lines. Then signals which are superimposed to the inteligence signals may be induced in the connecting lines and may saturate and "clog" the signal processing.

Therefore U.S. Pat. No. 4,945,323 provides a filter arrangement for filtering a plurality of connecting lines, which extend from a space containing electromagnetic fields through a multi-layer printed circuit board to a device located in a shielded chamber. The printed circuit board has a continuous, internal, grounded coating. As signal lead-through means, the grounded conductive coating has narrow apertures through which through-contacts extend at a small distance from the edges of the apertures. Electrically conductive coatings on those layers which are adjacent to the grounded conductive coating form filter capacitors with this grounded conductive coating. The conductive coatings on are connected with the through-contacts. Filter components in the form of SMD-components are mounted on the printed circuit board. The grounded, conducting coating extends to the edges of the printed circuit board . The edges of the printed circuit board are copper-plated all around and are well conductively connected with the housing.

In the structure of U.S. Pat. No. 4,945,323, the printed circuit board serves exclusively as a partition, which separates a "polluted" chamber containing electromagnetic fields from a shielded "clean" chamber.

SUMMARY OF THE INVENTION

Therefore, with the foregoing in mind it is the primary object of the invention to design a structure for the shielding of electronic components from outside electromagnetic fields in such a way tha a single printed circuit board serves both to separate a "polluted" space from a "clean" space and to accommodate the components of the device to be shielded itself.

According to a general aspect of the invention, the printed circuit board has a first region which is provided with an internal, grounded conductive coating, and a second region which carries the electronic components to be shielded. A housing forms a shielding partition which extends to the printed circuit board and has an end face engaging the printed circuit board between the first and second regions. The first chamber is limited by the first region of the printed circuit board. Shielding means for blocking electromagnetic fields are provided in the printed circuit board adjacent partition. These shielding means extend transversely to the surfaces of the printed circuit board. Through-contacts of conductor means extending to the electronic components in the first chamber extend insulatedly through the internal, grounded conductive coating The conductor means furthermore extend along the printed circuit board on the side of the grounded conductive coating remote from the first chamber and insulatedly through said transversely-extending shielding means to the electronic components.

BRIEF DESCRIPTION OF THE DRAWINGS

An embodiment of the invention is described in greater detail hereinbelow with reference to the accompanying drawings.

DETAILED DESCRIPTION OF THE PREFERRED EMBODIMENT

Figure 1:
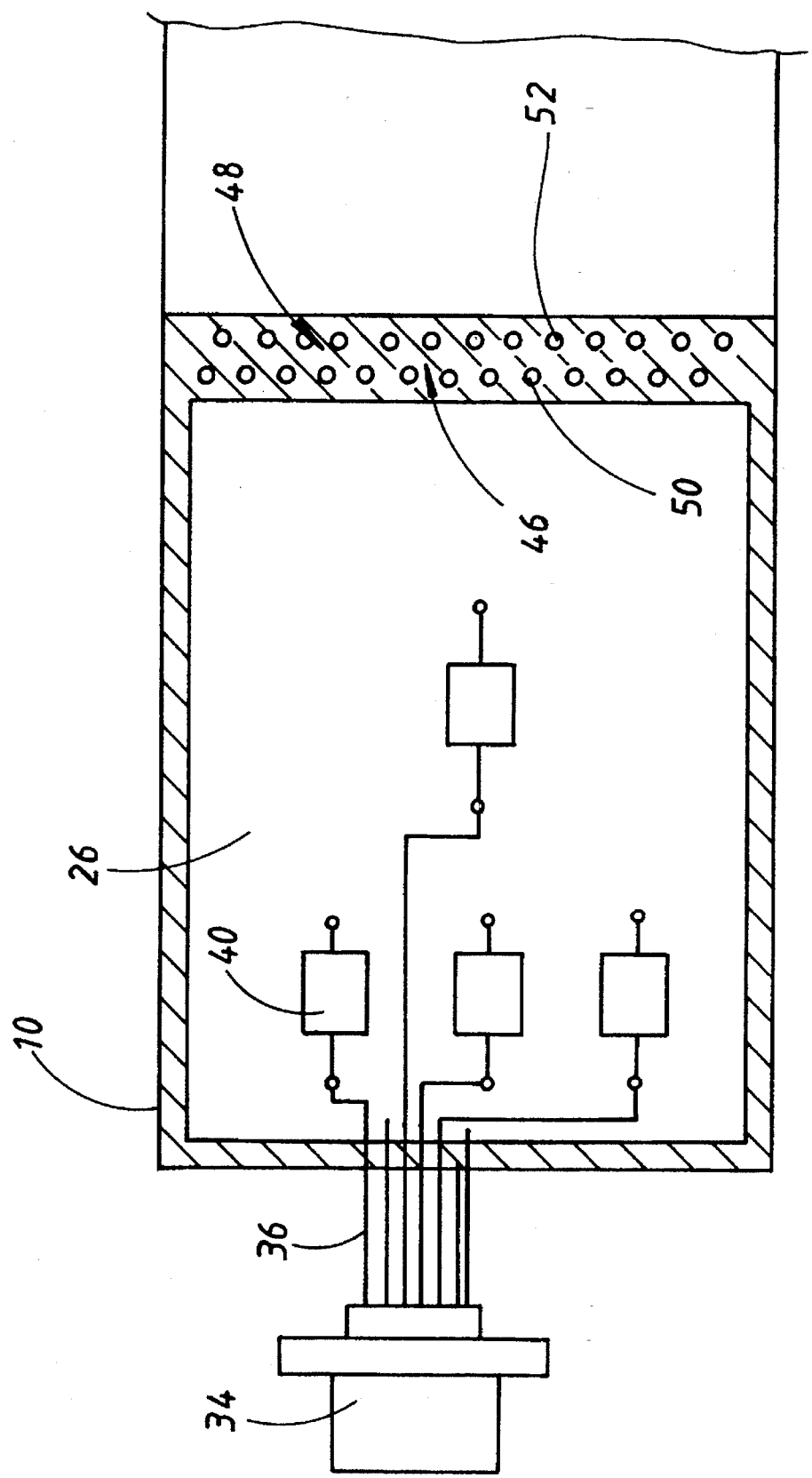
FIG. 1 is a sectional view, taken along line I—I of FIG. 2, of a structure for shielding electronic components arranged on a printed circuit board from outside electromagnetic fields.

Referring to FIG. 1, numeral 10 designates a rectangular housing of a shielding material. On its inner surface, the housing 10 has a ledge 12 with a lower engagement surface 14. The housing forms a partition 16. The partition 16 extends parallel to the end face 18 carrying the ledge 12. The partition 16 extends into the interior of the housing 10. An end face 20 of the partition 16 lies in the plane of the engagement surface 14 of the ledge 12. A printed circuit board in the form of a multi-layer printed circuit board 22 engages both the engagement surface 14 and the end face 20.

The printed circuit board 22, together with the housing 10 and the partition, defines a first chamber 24. The first chamber 24 is limited by a first region 26 of the printed circuit board 22. As will be explained below, the first chamber 24 is a "polluted" chamber, in which electromagnetic fields may be present. A second chamber 26 is defined by the housing 10, the partition 16 and a second region 30 of the printed circuit board 22, on the side of the partition 16 remote from the first chamber 24. The second chamber 28 is a "clean" room shielded from interfering electromagnetic fields. A clean chamber 32 is also defined below the printed circuit board 22, as viewed in FIG. 1. This chamber 32 can serve to accommodate further components and printed circuit boards (not shown).

An appliance plug 34 is mounted in that portion of the wall of the housing 10, which defines the first chamber 24. The appliance plug 34 contains terminals for a plurality of connecting lines 36. The connecting lines 36 carry signals to a shielded device or away from this device to the outside. Electronic components 38 of the shielded device are mounted in the second chamber 28 on the surface of the second region 20 of the printed circuit board 22.

Figure 2:
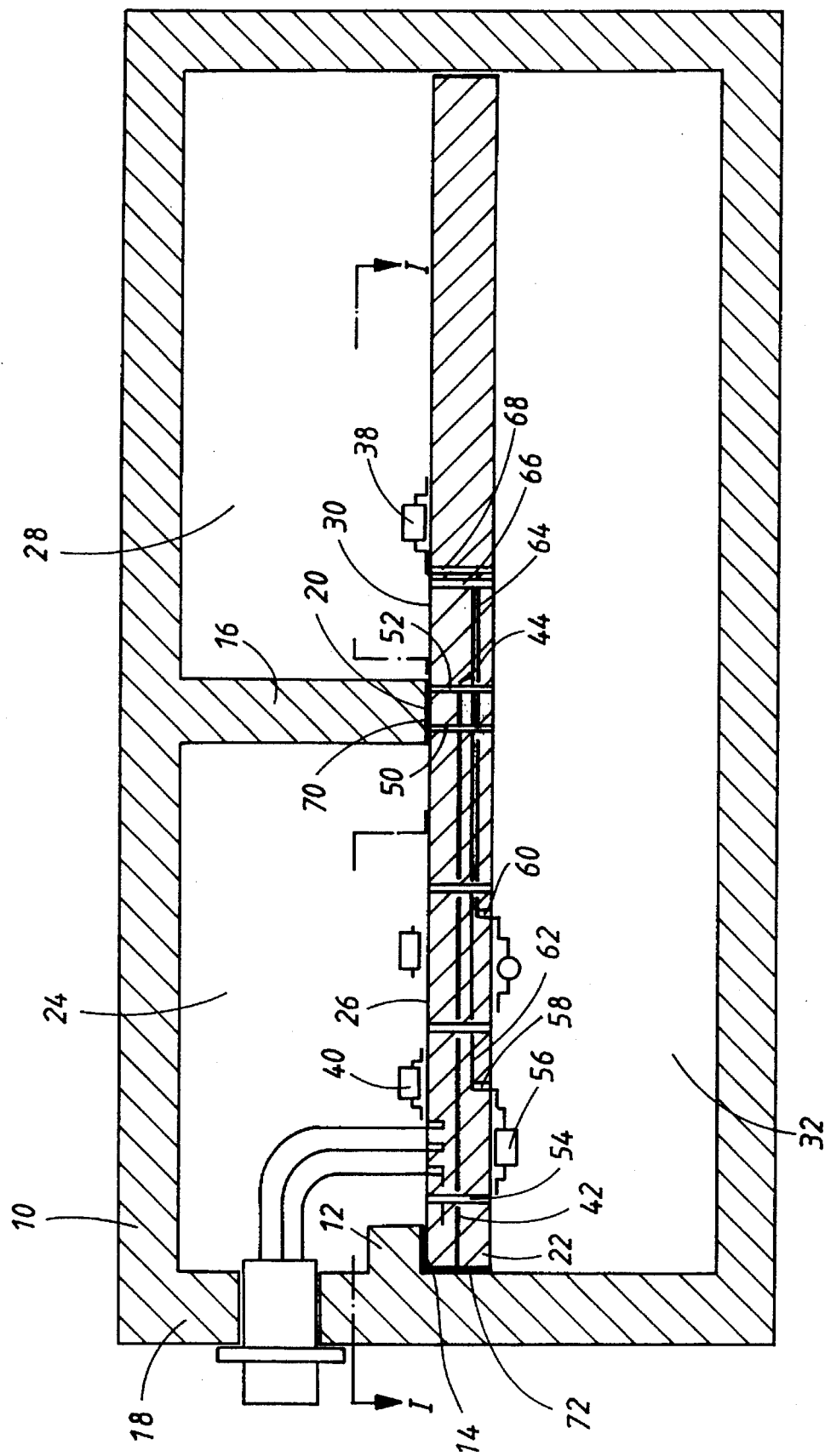
FIG. 2 is a sectional view taken along line II—II of FIG. 1.

High-frequency electromagnetic fields get into the first chamber 24 through the connecting lines 36. Filter components 40 are provided in the first chamber 24. These filter components 40 serve to suppress high-frequency signal components on the connecting lines and shunt such components to ground. The printed circuit board 22 has an internal, grounded conductive coating 42. The internal grounded conductive coating is a grounded metal coating between two layers of the multi-layer printed circuit board 22. The grounded conductive coating 42 extends substantially continuously over the whole first region 26 of the printed circuit board 22. The second region 30 of the printed circuit board 22 contains no such grounded conductive coating. The grounded conductive coating 42 is connected with the housing 10 in a manner to be described below. The grounded conductive coating 42 causes shielding from electromagnetic radiation out of the first chamber 24 towards the bottom in FIG. 2.

Shielding means 44 extend transversely to the surface of the printed circuit board 22 adjacent the partition 16 for shielding from electromagnetic fields which could get into the second chamber 28 within the printed circuit board 22 above the grounded conductive coating 42. The shielding means comprise rows 46 and 48 of through-contacts 50 and 52, respectively, of the printed circuit board 22 extending along the separating line between the first and second regions 26 and 30, respectively. In particular, the shielding means 44 are formed by two staggered, parallel rows 46 and 48 of through-contacts 50 and 52, respectively, of the printed circuit board 22. These shielding means 44 shield the second chamber from interfering electromagnetic radiation out of the first chamber 24. The shielding means 44 shield also the "clean" chamber 32 from the chamber 24.

The connecting lines 36 are lead out of the first chamber 24 to the electronic components in the following way:

After filtering by the filter components 40 arranged in the "polluted" chamber, the connecting lines are lead through through-contacts 54 into the "clean" chamber 32. The through-contacts 54 pass through apertures of the grounded conductive coating 42. The edges of the apertures have a small distance from the through-contacts such that there is no electrical contact but virtually no electrical fields can enter therethrough. In chamber 32, the signals are filtered by filter components 56, which are mounted on the lower side of the printed circuit board 22 bordering the chamber 32. Blind bore contacting means 58, 60 extending from the lower surface of the printed circuit board 22 are provided in the first region 26. These blind bore contacting means establish connection between the sections of the connecting lines 36 extending on the lower side of the printed circuit board 22 and conductor paths 62 and 64. The conductor paths 62 and 64 extend "below" the grounded conductive coating 42 between different layers of the multi-layer printed circuit board 22. The conductor paths 62 and 64 pass insulatedly between adjacent through-contacts 50 and 52 of the shielding means 44 into the second region 30. The conductor paths 62 and 64 are, in turn, connected with through-contacts in the second region 30. The through-contacts 66 and 68 are connected with contacts of electronic components 38. The electronic components 38, as described, are arranged in the shielded second chamber 28 but are mounted on the same printed circuit board which also contains the grounded conductive coating 42 and carries the filter elements 40, 56.

The end face 20 of the shielding partition 16 engages a conductor path 70 on the surface of the printed circuit board 22. The conductor path 70 is connected with the shielding means 44 extending transversely to the surface of the printed circuit board 22. Furthermore, the printed circuit board 22 has an electrically conductive coating 72 on one end face thereof. This electrically conductive coating, on one hand, engages the inner surface of the housing 10 and, on the other hand, is in contact with the internal grounded conductive coating 42 of the printed circuit board 22.

The printed circuit board 22 may contain filter components seving as protection against excessive voltage (lightning protection).

In many cases, the filter band width has to extend up to 40 gigacycles per second (RADAR). This cannot be achieved with discrete filter components. Therefore the printed circuit board 22 may, furthermore, contain filter elements in the form of conductor paths (coils, capacitors) within the printed circuit board 22.

While there is shown and described a present preferred exemplary embodiment of the invention, it is to be distinctly understood that the invention is not limited thereto, but may be otherwise variously embodied and practiced within the scope of the following claims. Accordingly,

What we claim is:

1. A structure for the shielding of electronic components (38) arranged on a printed circuit board from outside electromagnetic fields, comprising a shielding housing means (10), which defines a first chamber (24) exposed to electromagnetic fields and a shielded second chamber (28), electric conductor means (36) extending to said electronic components (38) in said first chamber, and a multi-layer printed circuit board (22) provided with outer surfaces and an internal, grounded conductive coating (42), said conductor means including through-contacts (54) passing through said multi-layer printed circuit board, wherein (a) said printed circuit board (22) has a first region (26) which is provided with said internal, grounded conductive coating (42), and a second region (30) which carries said electronic components (38) to be shielded, (b) said housing (10) forms a shielding partition (16) which extends to said printed circuit board (22) and has an end face (20) engaging said printed circuit board (22) between said first and second regions (26 and 30, respectively), said first chamber being limited by said first range (26) of said printed circuit board (22), (c) shielding means (44) for blocking electromagnetic fields are provided in said printed circuit board (22) adjacent said partition (16), said shielding means (44) extending transversely to said surfaces of said printed circuit board, (d) said through-contacts (54) of said conductor means (36) extending insulatedly through said internal, grounded conductive coating (42), and (e) said conductor means (36) furthermore extending along said printed circuit board (22) on the side of the grounded conductive coating (42) remote from said first chamber (24) and insulatedly through said transversely-extending shielding means (44) to said electronic components (38).

2. A structure as claimed in claim 1, wherein said printed circuit board carries filter elements (40,56) in said first region.

3. A structure as claimed in claim 1, wherein said printed circuit board incorporates filter elements in the form of conductor paths within said printed circuit board.

4. A structure as claimed in claim 3, wherein said conductor paths define coils.

5. A structure as claimed in claim 3, wherein said conductor paths define capacitors.

6. A structure as claimed in claim 1 wherein said transversely-extending shielding means (44) comprise at least one row (46,48) spaced through contacts (50,52) extending through said printed circuit board (22) along a notional partition line between said first and second regions (26 and 30, respectively).

7. A structure as claimed in claim 6, wherein said transversely-extending shielding means (44) comprise at least two staggered parallel rows (46,58) of through-contacts (50,52) of said printed circuit board (22).

8. A structure as claimed in claim 1, wherein
   first filter components (40) for shunting high-frequency, electric fields are provided on said printed circuit board (22) within said first chamber (24), and
   second filter components (56) for shunting high-frequency electric fields are provided, also on said printed circuit board (22) on the side thereof remote from said first chamber (24) and in said first region (26).

9. A structure as claimed in claim 1, wherein contacting means (58,60) are provided on said printed circuit board in said first region (26) and on the side thereof remote from said first chamber, said contacting means, on one hand, being connected with a connection line forming part of a respective one of said conductor means (36) and, on the other hand, being connected with a respective conductor path (62,64) of said printed circuit board (22), said conductor path (62,64) extending insulatedly through said transversely-extending shielding means (44) and being, in turn, connected through contacting means (66,68) with at least one of said electronic components (38) to be shielded.

10. A structure as claimed in claim 7, wherein said contacting means (58,60) in said first region (26) are blind bore contacting means which extend only on the side of said grounded conductive coating (42) remote from said first chamber (24).

11. A device as claimed in claim 1, wherein said printed circuit board (22) carries a conductor path (70) adjacent said shielding partition, said end face (20) of said shielding partition (16) engaging said conductor path (70) on said surface of said printed circuit board (22), said conductor path being in contact with said transversely-extending shielding means (44).

12. A structure as claimed in claim 11, wherein said printed circuit board has an electrically conductive coating (72) on at least one end face, said coating, on one hand, engaging said housing at an inner surface thereof and, on the other hand, being in contact with said internal, grounded conductive coating.

13. A structure as claimed in claim 1, wherein said printed circuit board includes filter means for protecting said electronic components from excessive voltage.

\* \* \* \* \*